US010340861B2

(12) United States Patent
Ye et al.

(10) Patent No.: US 10,340,861 B2
(45) Date of Patent: Jul. 2, 2019

(54) APPARATUS AND METHODS FOR LOW NOISE AMPLIFIERS

(71) Applicant: SKYWORKS SOLUTIONS, INC., Woburn, MA (US)

(72) Inventors: Peihua Ye, Irvine, CA (US); Engin Ibrahim Pehlivanoglu, Costa Mesa, CA (US); Eric J. Marsan, Lowell, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/782,032

(22) Filed: Oct. 12, 2017

(65) Prior Publication Data

US 2018/0145648 A1 May 24, 2018

Related U.S. Application Data

(60) Provisional application No. 62/424,056, filed on Nov. 18, 2016.

(51) Int. Cl.
*H03F 3/191* (2006.01)
*H03F 3/21* (2006.01)
*H03F 3/193* (2006.01)
*H03F 1/26* (2006.01)
*H03F 1/02* (2006.01)
(Continued)

(52) U.S. Cl.
CPC .......... *H03F 3/21* (2013.01); *H03F 1/0277* (2013.01); *H03F 1/223* (2013.01); *H03F 1/26* (2013.01); *H03F 3/193* (2013.01); *H03F 3/211* (2013.01); *H03F 3/72* (2013.01); *H03F 2200/06* (2013.01); *H03F 2200/294* (2013.01); *H03F 2200/451* (2013.01); *H03F 2203/45611* (2013.01); *H03F 2203/7236* (2013.01)

(58) Field of Classification Search
CPC .............. H03F 3/21; H03F 3/193; H03F 1/26
USPC ... 330/51, 151, 86, 110, 302, 305, 306, 282, 330/311
See application file for complete search history.

(56) References Cited

U.S. PATENT DOCUMENTS

| 4,859,967 A | 8/1989 | Swanson |
| 5,847,610 A | 12/1998 | Fujita |
| 6,188,277 B1 | 2/2001 | Borodulin et al. |

(Continued)

FOREIGN PATENT DOCUMENTS

JP       2008-054260 A       3/2008

*Primary Examiner* — Khanh V Nguyen
*Assistant Examiner* — Khiem D Nguyen
(74) *Attorney, Agent, or Firm* — Knobbe Martens Olson & Bear LLP

(57) ABSTRACT

Apparatus and methods for low noise amplifiers (LNAs) are provided herein. In certain configurations, an LNA includes a gain stage and a bypass stage electrically connected in parallel with one another between an input and an output. The bypass stage and the gain stage are selectively activated based on a mode of the LNA. For example, the gain stage provides inverting amplification to an input signal received at the input in a gain mode. Additionally, the bypass stage provides a low gain path from the input to the output in a bypass mode. Additionally, the bypass stage includes a balun that provides inversion to the bypass stage such that a phase delay through the bypass stage is similar to a phase delay of the gain stage.

20 Claims, 12 Drawing Sheets

(51) Int. Cl.
*H03F 1/22* (2006.01)
*H03F 3/72* (2006.01)

(56) References Cited

U.S. PATENT DOCUMENTS

| | | | |
|---|---|---|---|
| 6,522,195 B2 * | 2/2003 | Watanabe | H03F 3/1935 |
| | | | 330/151 |
| 6,744,310 B2 | 6/2004 | Honda | |
| 6,927,646 B2 | 8/2005 | Niemi | |
| 7,348,854 B1 | 3/2008 | Mordkovich | |
| 7,515,000 B1 | 4/2009 | Jin et al. | |
| 8,362,840 B2 | 1/2013 | Andrys et al. | |
| 8,610,503 B2 | 12/2013 | Kaczman et al. | |
| 9,595,926 B2 | 3/2017 | Quaglietta | |
| 9,847,804 B2 | 12/2017 | Lee et al. | |
| 2004/0008094 A1 | 1/2004 | Niemi | |
| 2011/0291765 A1 | 12/2011 | Sun et al. | |
| 2011/0292554 A1 | 12/2011 | Yao et al. | |
| 2014/0256271 A1 | 9/2014 | Kok | |
| 2016/0094192 A1 | 3/2016 | Khesbak et al. | |
| 2017/0279415 A1 | 9/2017 | Wallis | |

* cited by examiner

APPARATUS AND METHODS FOR LOW NOISE AMPLIFIERS

CROSS-REFERENCE TO RELATED APPLICATIONS

This application claims the benefit of priority under 35 U.S.C. § 119 of U.S. Provisional Patent Application No. 62/424,056, filed Nov. 18, 2016 and titled "APPARATUS AND METHODS FOR LOW NOISE AMPLIFIERS," which is herein incorporated by reference in its entirety.

BACKGROUND

Technical Field

Embodiments of the invention relate to electronic systems, and in particular, to radio frequency (RF) electronics.

Description of Related Technology

A low noise amplifier (LNA) can be used to boost the amplitude of a relatively weak radio frequency (RF) signal received via an antenna. Thereafter, the boosted RF signal can be used for a variety of purposes, including, for example, driving a switch, a mixer, and/or a filter in an RF communication system.

Examples of RF communication systems with one or more LNAs include, but are not limited to, mobile phones, tablets, base stations, network access points, customer-premises equipment (CPE), laptops, and wearable electronics.

LNAs can be included in RF communication systems to amplify signals of a wide range of frequencies. For example, an LNA can be used to provide low noise amplification to RF signals in a frequency range of about 30 kHz to 300 GHz, such as in the range of about 450 MHz to about 6 GHz for certain communications standards.

SUMMARY

In certain embodiments, the present disclosure relates to a wireless communication device. The wireless communication device includes a low noise amplifier including a mode control circuit configured to operate the low noise amplifier in a selected mode chosen from a plurality of modes including a first gain mode and a bypass mode. The low noise amplifier further includes a first gain circuit electrically connected between an input and an output and operable to provide inverting amplification to a radio frequency input signal received at the input in the first gain mode, and a bypass circuit electrically connected in parallel with the first gain circuit between the input and the output. The bypass circuit includes a balun operable to provide inversion to the radio frequency input signal in the bypass mode so as to compensate for a difference in phase delay between the bypass circuit and the first gain circuit. The wireless communication device further includes an antenna configured to provide the radio frequency input signal to the low noise amplifier.

In some embodiments, the low noise amplifier further includes a phase compensation circuit electrically connected to the output and configured to further compensate for the difference in phase delay. In a number of embodiments, the phase compensation circuit includes a plurality of capacitors that are digitally selectable. In several embodiments, the low noise amplifier further includes a serial interface configured to receive data operable to control an amount of phase adjustment provided by the phase compensation circuit. According to various embodiments, the balun is operable to provide a coarse phase adjustment and the phase compensation circuit is operable to provide a fine phase adjustment.

In several embodiments, the low noise amplifier further includes a serial interface configured to receive data operable to control the selected mode chosen by the mode control circuit.

In accordance with certain embodiments, the low noise amplifier further includes an input matching inductor electrically connected between the input and a radio frequency terminal, and the balun has an inductance that compensates for a loss of the input matching inductor.

In some embodiments, the mode control circuit is operable to select the bypass circuit and deselect the first gain circuit in the bypass mode, and to select the first gain circuit and deselect the bypass circuit in the first gain mode. In several embodiments, the bypass circuit and the first gain circuit each include at least one selection field-effect transistor including a gate controlled by the mode control circuit.

In accordance with several embodiments, the low noise amplifier further includes a second gain circuit electrically connected between the input and the output in parallel with the first gain circuit, and the second gain circuit is operable to provide inverting amplification to the radio frequency input signal in a second gain mode of the plurality of modes.

In various embodiments, the first gain circuit includes a transconductance transistor electrically connected in series with a cascode transistor, and the transconductance transistor includes a gate configured to receive the radio frequency input signal.

In some embodiments, the balun includes a primary winding and a secondary winding, and the primary winding and the secondary winding are connected to ground on opposite ends relative to one another such that the balun provides inversion.

In several embodiments, the bypass circuit further includes a tuning capacitor electrically connected between an input to the balun and ground.

In certain embodiments, the present disclosure relates to a low noise amplifier. The low noise amplifier includes a mode control circuit configured to operate the low noise amplifier in a selected mode chosen from a plurality of modes including a first gain mode and a bypass mode. The low noise amplifier further includes a first gain circuit electrically connected between an input configured to receive a radio frequency input signal and an output configured to provide a radio frequency output signal. The first gain circuit is operable to provide inverting amplification to the radio frequency input signal in the first gain mode. The low noise amplifier further includes a bypass circuit electrically connected in parallel with the first gain circuit between the input and the output. The bypass circuit includes a balun operable to provide inversion to the radio frequency input signal in the bypass mode so as to compensate for a difference in phase delay between the bypass circuit and the first gain circuit.

In some embodiments, the low noise amplifier further includes a phase compensation circuit electrically connected to the output and configured to further compensate for the difference in phase delay. In a number of embodiments, the phase compensation circuit includes a plurality of capacitors that are digitally selectable. In several embodiments, the low noise amplifier further includes a serial interface configured to receive data operable to control an amount of phase adjustment provided by the phase compensation circuit. In accordance with various embodiments, the balun is operable to provide a coarse phase adjustment and the phase compensation circuit is operable to provide a fine phase adjustment.

According to a number of embodiments, the low noise amplifier further includes a serial interface configured to receive data operable to control the selected mode chosen by the mode control circuit.

In several embodiments, the low noise amplifier further includes an input matching inductor electrically connected between the input and a radio frequency terminal, and the balun has an inductance that compensates for a loss of the input matching inductor.

In various embodiments, the mode control circuit is operable to select the bypass circuit and deselect the first gain circuit in the bypass mode, and to select the first gain circuit and deselect the bypass circuit in the first gain mode. In accordance with certain embodiments, the bypass circuit and the first gain circuit each include at least one selection transistor having a gate controlled by the mode control circuit.

In accordance with some embodiments, the low noise amplifier further includes a second gain circuit electrically connected between the input and the output in parallel with the first gain circuit, and the second gain circuit is operable to provide inverting amplification to the radio frequency input signal in a second gain mode of the plurality of modes.

In a number of embodiments, the low noise amplifier is implemented on a semiconductor die.

In some embodiments, the first gain circuit includes a transconductance transistor electrically connected in series with a cascode transistor, and the transconductance transistor includes a gate configured to receive the radio frequency input signal.

In several embodiments, the balun includes a primary winding and a secondary winding, and the primary winding and the secondary winding are connected to ground on opposite ends relative to one another such that the balun provides inversion.

In various embodiments, the bypass circuit further includes a tuning capacitor electrically connected between an input to the balun and ground.

In certain embodiments, the present disclosure relates to a radio frequency front-end system. The radio frequency front-end system includes a low noise amplifier including a mode control circuit configured to operate the low noise amplifier in a selected mode chosen from a plurality of modes including a first gain mode and a bypass mode, a first gain circuit electrically connected between an input and an output and operable to provide inverting amplification to a radio frequency input signal received at the input in the first gain mode, and a bypass circuit electrically connected in parallel with the first gain circuit between the input and the output. The bypass circuit includes a balun operable to provide inversion to the radio frequency input signal in the bypass mode so as to compensate for a difference in phase delay between the bypass circuit and the first gain circuit. The radio frequency front-end system further includes an input switch including a first throw operable to provide the radio frequency input signal to the input of the low noise amplifier.

In a number of embodiments, the radio frequency front-end system further includes a power amplifier, and the input switch further includes a second throw electrically connected to an output of the power amplifier.

In several embodiments, the radio frequency front-end system further includes an output switch having at least a first throw electrically connected to the output of the low noise amplifier.

In accordance with a number of embodiments, the input switch is configured to electrically connect the input of the low noise amplifier to an antenna in a first state.

In various embodiments, the low noise amplifier including the balun is implemented on a semiconductor die.

According to certain embodiments, the radio frequency front-end system further includes a phase compensation circuit electrically connected to the output and configured to further compensate for the difference in phase delay. In some embodiments, the phase compensation circuit includes a plurality of capacitors that are digitally selectable. In several embodiments, the radio frequency front-end system further includes a serial interface configured to receive data operable to control an amount of phase adjustment provided by the phase compensation circuit. In accordance with various embodiments, the balun is operable to provide a coarse phase adjustment and the phase compensation circuit is operable to provide a fine phase adjustment.

In a number of embodiments, the radio frequency front-end system further includes a serial interface configured to receive data operable to control the selected mode chosen by the mode control circuit.

In some embodiments, the low noise amplifier further includes an input matching inductor electrically connected between the input and a radio frequency terminal, the balun having an inductance that compensates for a loss of the input matching inductor.

According to several embodiments, the mode control circuit is operable to select the bypass circuit and deselect the first gain circuit in the bypass mode, and to select the first gain circuit and deselect the bypass circuit in the first gain mode. In various embodiments, the bypass circuit and the first gain circuit each include at least one selection transistor having a gate controlled by the mode control circuit.

In a number of embodiments, the low noise amplifier further includes a second gain circuit electrically connected between the input and the output in parallel with the first gain circuit, and the second gain circuit is operable to provide inverting amplification to the radio frequency input signal in a second gain mode of the plurality of modes.

In some embodiments, the radio frequency front-end system is implemented on a semiconductor die.

In various embodiments, the first gain circuit includes a transconductance transistor electrically connected in series with a cascode transistor, and the transconductance transistor includes a gate configured to receive the radio frequency input signal.

In several embodiments, the balun includes a primary winding and a secondary winding, and the primary winding and the secondary winding are connected to ground on opposite ends relative to one another such that the balun provides inversion.

In some embodiments, the bypass circuit further includes a tuning capacitor electrically connected between an input to the balun and ground.

In certain embodiments, the present disclosure relates to a method of low noise amplification. The method includes controlling a mode of a low noise amplifier to a gain mode, providing inverting amplification to a radio frequency input signal in the gain mode using a gain circuit of the low noise amplifier, changing the mode of the low noise amplifier from the gain mode to a bypass mode, bypassing the gain circuit in the bypass mode using a bypass circuit of the low noise amplifier, and compensating for a difference in phase delay between the bypass circuit and the gain circuit using a balun that inverts the radio frequency input signal in the bypass mode.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
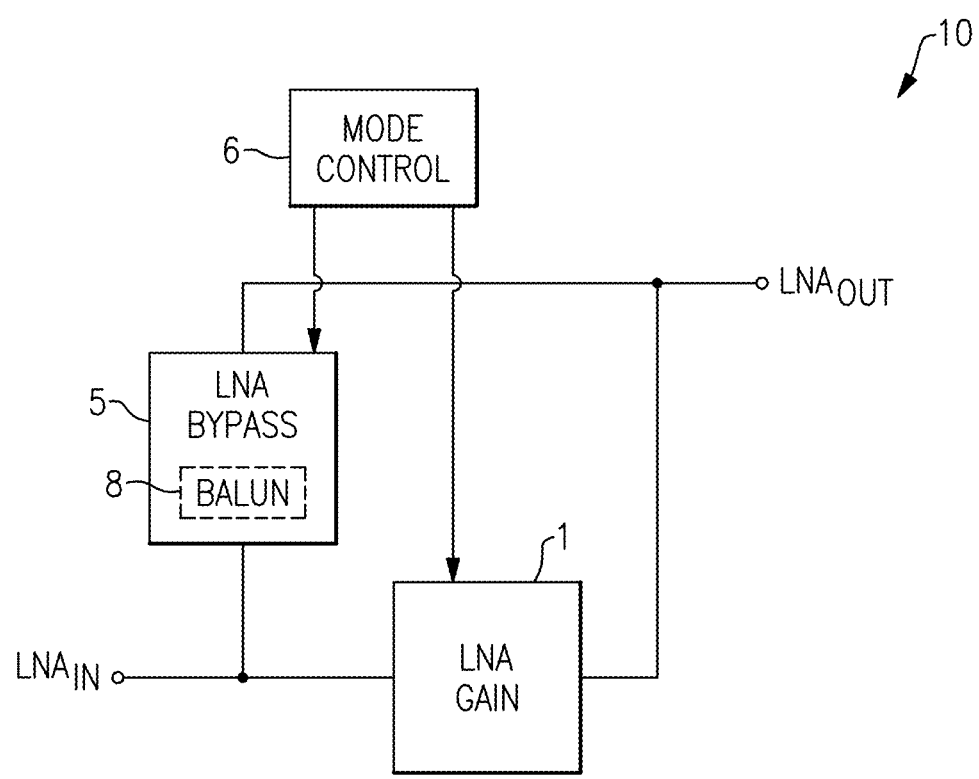
FIG. 1 is a schematic diagram of one embodiment of a low noise amplifier (LNA).

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Examples of LNAs with a Bypass Stage Including a Balun for Phase Delay Matching

It is desirable for a low noise amplifier (LNA) to be operable in multiple modes. In one example, an LNA is included in a receive path of a radio frequency (RF) system, and the mode of the LNA is selected to provide a suitable amount of gain in the receive path. In certain implementations, the mode of LNA is controlled by a transceiver, such as circuitry used for automatic gain control (AGC).

For example, an amount of desired gain in a receive path can vary with carrier system design as well as with operating conditions and/or environment. Accordingly, a mode of the LNA can be changed over time to achieve an appropriate amount of receive path gain at a particular time instance. In certain implementations, the LNA includes a bypass mode corresponding to the mode with the lowest gain.

For example, the bypass mode can be used to route a received RF signal through a bypass signal path that bypasses one or more LNA amplification circuits, such as LNA gain stages. Thus, when the RF signal is routed through the bypass signal path, the RF signal has lower gain because the RF signal avoids boosting or amplification by at least a portion of the LNA's amplification circuitry.

Although configuring an LNA to be operable in multiple modes is desirable, such a configuration can also adversely impact the performance of the LNA. For instance, when the LNA is switched from one mode to another mode, the LNA may exhibit a relatively abrupt change of phase that generates a phase discontinuity in the LNA's output signal. Such a phase discontinuity can lead to a variety of problems, including, for example, loss of frames and/or limitations in moving about a cell in mobile applications.

Apparatus and methods for LNAs are provided herein. In certain configurations, an LNA includes a gain circuit and a bypass circuit electrically connected in parallel with one another between an input and an output. The bypass circuit and the gain circuit are selectively activated based on a mode of the LNA. In one example, the gain circuit amplifies an input signal received at the input in a gain mode, and is bypassed in favor or routing the input signal through the bypass circuit in a bypass mode. Additionally, the gain circuit provides inverting amplification to the input signal in the gain mode, and the bypass circuit provides a low gain path from the input to the output in the bypass mode. The bypass circuit includes a balun that provides inversion when the input signal propagates through the bypass circuit such that a phase delay through the bypass circuit is similar to a phase delay of the gain circuit. Thus, the balun of the bypass circuit compensates for a difference in phase delay between a signal path through the gain circuit and a signal path through the bypass circuit.

By including the balun, the signal path through the bypass circuit has a phase delay that is similar to or matched to a phase delay of the signal path through the gain circuit. Thus, the LNA can maintain phase matching between different modes (including, for instance, between a bypass mode and a high gain mode) even when the LNA's amplification circuit provides inverting gain, for instance, common-emitter or common-source implementations of transistor amplifiers.

The LNAs herein can exhibit superior phase performance, such as reduced or eliminated phase discontinuity when switching the LNA between modes. In certain embodiments, inclusion of the balun matches the phase delay of the bypass circuit to the phase delay of the gain circuit to within about 5 degrees at a frequency of interest, such as a fundamental frequency of the input signal.

The teachings herein are applicable to LNAs implemented in a wide variety of ways. For example, an LNA can include circuits or stages implemented using a wide range of circuit topologies, including bipolar transistor configurations, field-effect transistor (FET) configurations (such as metal oxide semiconductor (MOS) transistor implementations), or configurations using a combination of bipolar and field-effect transistors.

FIG. 1 is a schematic diagram of one embodiment of an LNA 10. The LNA 10 includes a gain stage or circuit 1, a bypass stage or circuit 5, and a mode control circuit 6. As shown in FIG. 1, the bypass stage 5 includes a balun 8.

Although FIG. 1 illustrates one embodiment of an LNA including a balun, the teachings herein are applicable to LNAs implemented in a wide variety of ways. Accordingly, other implementations of LNAs are possible, including, but not limited to, LNAs including additional modes and/or stages. Moreover, the LNA 10 can include additional circuitry, such as circuitry used for biasing and/or matching. Furthermore, in another embodiment, the mode control circuit 6 is separate from the LNA 10. For example, the mode control circuit 6 can be fabricated on a separate integrated circuit (IC) or die.

The LNA 10 receives an RF input signal at the input $LNA_{IN}$, and provides an RF output signal at the output $LNA_{OUT}$. In certain configurations, the RF output signal can be provided from the output $LNA_{OUT}$ to a transceiver. For example, the transceiver can include a demodulator that down-shifts the RF output signal to baseband or an intermediate frequency for further processing.

In the illustrated embodiment, the LNA 10 receives the RF input signal at the input $LNA_{IN}$, and provides the RF output signal to the output $LNA_{OUT}$. The mode control circuit 6 controls operation of the LNA 10 in a selected mode chosen from a plurality of different operating modes. Based on the selected mode, the RF input signal is routed through the bypass stage 5 or the gain stage 1 to generate the RF output signal.

In the illustrated embodiment, the mode control circuit 6 provides a first selection control signal to the bypass stage 5 and a second selection control signal to the gain stage 2. The multiple modes include at least a bypass mode in which the bypass stage 5 is selected and the gain stage 1 is deselected, and a gain mode in which the bypass stage 5 is deselected and the gain stage 1 is selected.

In certain configurations, the mode control circuit 6 receives mode selection data used to control selection of the mode. For example, the LNA 10 can be implemented on a semiconductor die or chip that includes an interface that receives the mode selection data from a transceiver or other component. For instance, the chip can include a mobile industry processor interface (MIPI) radio frequency front-end (RFFE) bus, an inter integrated circuit ($I^2C$) bus, a serial peripheral interface (SPI) bus, or other suitable interface for receiving the mode selection data.

The gain stage 1 provides inverting amplification, which provides a phase shift of about 180 degrees. Although the gain stage 1 provides inverting amplification, the gain stage 1 can also include other circuitry and/or components that can impact a phase delay through the gain stage 1.

As shown in FIG. 1, the bypass stage 5 includes a balun 8, which provides about 180 degrees of phase shift to compensate for the inversion of the gain stage 1. In certain implementations, the balun 8 includes a ground connection on opposite ends of the primary and secondary windings, thereby providing signal inversion.

Accordingly, the balun 8 provides inversion to signals propagating through the bypass stage 5, such that a phase delay through the bypass stage 5 is similar to a phase delay of the gain stage 1. Thus, the gain stage 1 can be implemented using a common-source, common-emitter, or other inverting amplifier configuration, and the balun 8 provides phase compensation such that the bypass path has a phase matched to a phase of the gain path.

Accordingly, the LNA 10 can maintain phase matching between different modes, and the LNA 10 exhibits superior phase performance, such as reduced or eliminated phase discontinuity when the mode control circuit 6 switches the LNA 10 from one mode to another mode.

In contrast, an LNA with modes of different phase delays may exhibit a relatively abrupt change of phase when the LNA is switched from one mode to another mode. The abrupt change of phase generates a phase discontinuity in the LNA's output signal, which can lead to a variety of problems, including, for example, loss of frames and/or limitations in moving about a cell of a mobile network.

Figure 2:
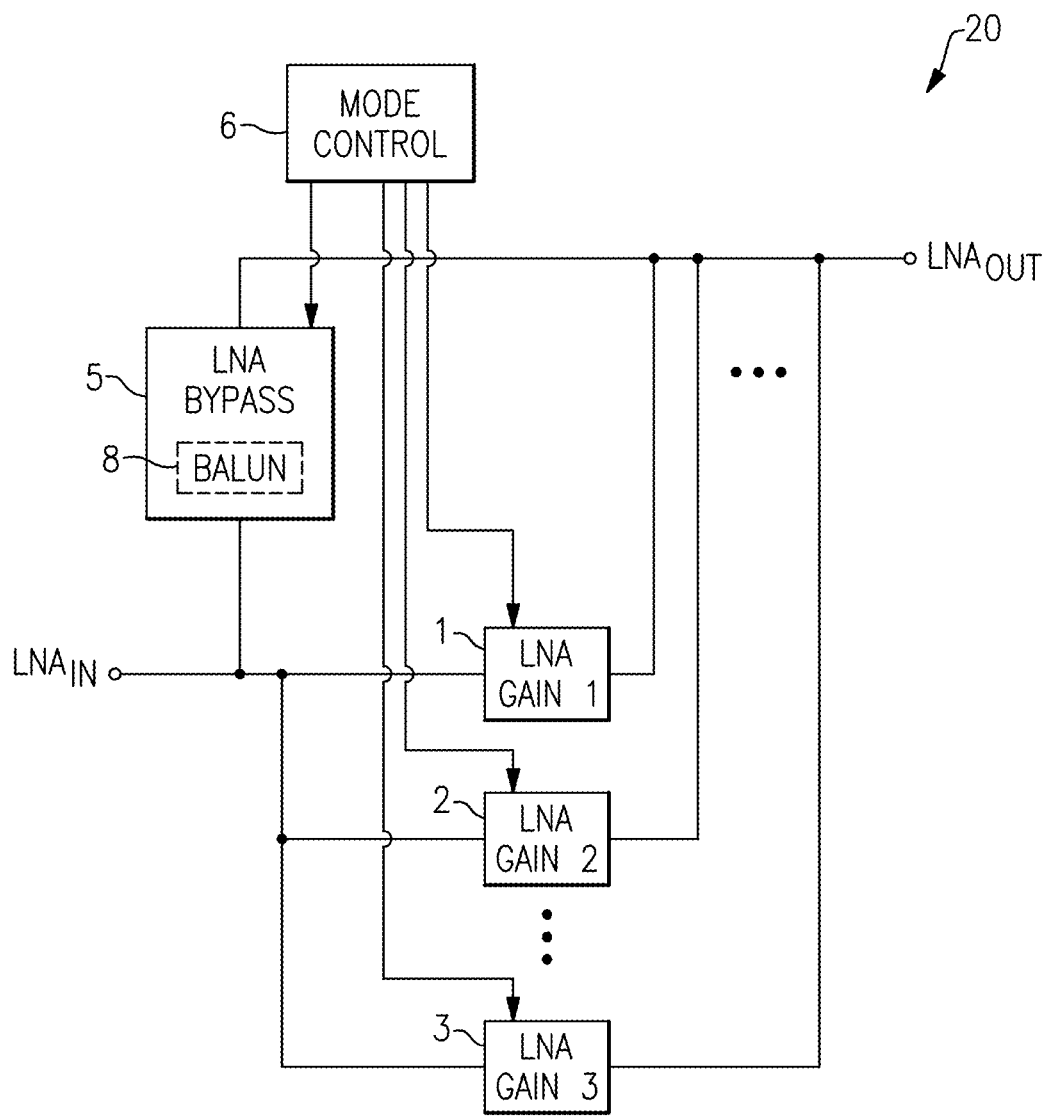
FIG. 2 is a schematic diagram of another embodiment of an LNA.

FIG. 2 is a schematic diagram of another embodiment of an LNA 20. The LNA 20 includes a first gain stage 1, a second gain stage 2, a third gain stage 3, a bypass stage 5, and a mode control circuit 6.

The LNA 20 of FIG. 2 is similar to the LNA 10 of FIG. 1, except that the LNA 20 is implemented with additional gain modes and gain stages. As shown in FIG. 2, the first gain stage 1, the second gain stage 2, the third gain stage 3, and the bypass stage 5 are electrically connected in parallel with one another between the input $LNA_{IN}$ and the output $LNA_{OUT}$.

Additionally, the mode control circuit 6 controls operation of the LNA 20 in a selected mode chosen from a plurality of different operating modes.

In the illustrated embodiment, the mode control circuit 6 selects the first gain stage 1 and deselects the other stages in a first gain mode. Additionally, the mode control circuit 6 selects the second gain stage 2 and deselects the other stages in a second gain mode. Furthermore, the mode control circuit 6 selects the third gain stage 3 and deselects the other stages in a third gain mode. Additionally, the mode control circuit 6 selects the bypass stage 5 and deselects the other stages in a bypass mode.

Although the illustrated embodiment includes four modes, other configurations are possible. For example, an LNA can include more or fewer stages to achieve a desired number of modes. For instance, more or fewer gain stages (for example, 1, 2, 3, or 4 or more) can be included and/or additional bypass stages can be provided. Moreover, in certain implementations, an LNA can include modes in which two or more stages simultaneously operate in parallel with one another to generate an output signal.

In the illustrated embodiment, the first to third gain stages 1-3 each provide inverting amplification. Additionally, the bypass stage 5 includes the balun 8 to provide a phase shift to match the inversion of the gain stages, thereby compensating for a difference in phase delay of the bypass stage 5 relative to the phase delays of the gain stages 1-3.

Thus, the balun 8 provides phase compensation such that the bypass stage has a phase similar to a phase of each of the gain stages 1-3. Accordingly, the LNA 20 can maintain phase matching between different modes, and the LNA 20 exhibits superior phase performance, such as reduced or eliminated phase discontinuity when the mode control circuit 6 switches the LNA 20 from one mode to another mode.

Figure 3:
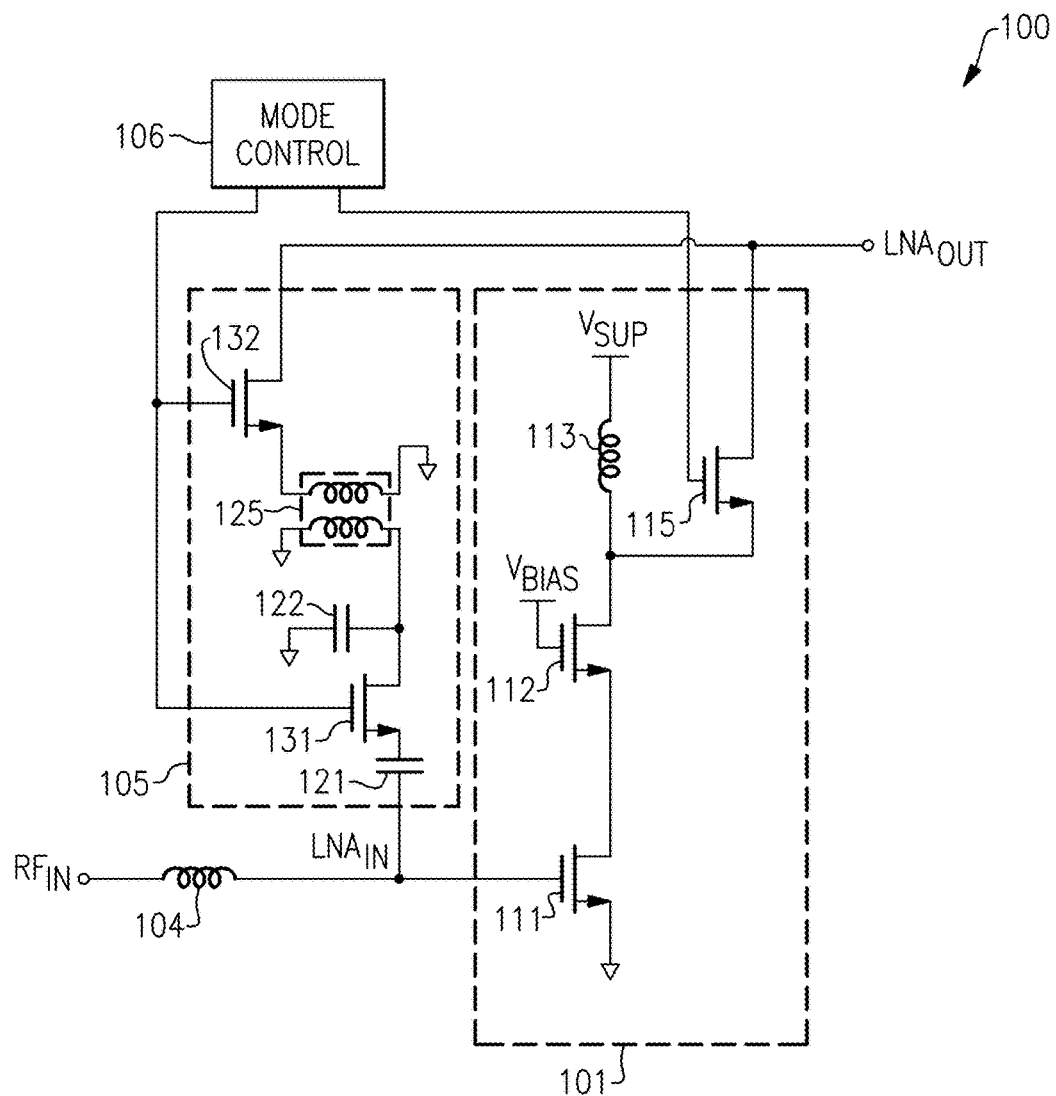
FIG. 3 is a schematic diagram of another embodiment of an LNA.

FIG. 3 is a schematic diagram of another embodiment of an LNA 100. The LNA 100 includes a gain stage 101, an input matching inductor 104, a bypass stage 105, and a mode control circuit 106. The gain stage 101 and the bypass stage 105 are electrically connected in parallel with one another between an input $LNA_{IN}$ and an output $LNA_{OUT}$. Additionally, the input matching inductor 104 is electrically connected between an RF terminal $RF_{IN}$ and the input $LNA_{IN}$.

The LNA 100 of FIG. 3 is similar to the LNA 10 of FIG. 1, except that the LNA 100 of FIG. 3 illustrates a specific implementation of a gain stage and of a bypass stage. Although specific implementations of stages are illustrated, the teachings herein are applicable to stages implemented in a wide variety of ways.

As shown in FIG. 3 the gain stage 101 includes a transconductance (gm) FET 111, a cascode FET 112, a choke inductor 113, and a gain stage selection FET 115. In the illustrated embodiment, the gm FET 111 includes a source electrically connected to a ground voltage. In another embodiment, a degeneration inductor and/or resistor is included between the source of the gm FET 111 and the ground voltage to provide inductive and/or resistive degeneration.

Although an example in which FETs are used for mode selection is shown, the teachings herein are applicable to other types of mode selection, including, but not limited to, configurations in which mode selection is provided using other types of switches.

The gm FET 111 includes a gate that receives an RF input signal, and a drain that is connected to a source of the cascode FET 112. The gm FET 111 provides inverting amplification to the RF input signal, and provides an amplified inverted signal to the cascode FET 112. The cascode FET 112 includes a gate biased by a bias voltage $V_{BIAS}$. Additionally, the drain of the cascode FET 112 is biased by a supply voltage $V_{SUP}$ received via the choke inductor 113.

As shown in FIG. 3, the gain stage selection FET 115 is connected between the drain of the cascode FET 112 and the output $LNA_{OUT}$. Accordingly, when the mode control circuit 106 selects the gain stage 101 via the gain stage selection FET 115, an inverted amplified signal is provided to the output $LNA_{OUT}$.

The bypass stage 105 includes a DC blocking capacitor 121, an input bypass stage selection FET 131, a tuning capacitor 122, a balun 125, and an output bypass stage selection FET 132.

The blocking capacitor 121 is electrically connected between the input $LNA_{IN}$ and a source of the input bypass stage selection FET 131, and serves to provide DC voltage blocking that allows DC biasing of the bypass stage 105 to be separately controlled relative to a DC bias voltage provided to a gate of the gm FET 111. For clarity of the figures, certain biasing circuitry has been omitted from FIG. 3.

The gates of the input bypass stage selection FET 131 and the output bypass stage selection FET 132 are controlled by the mode control circuit 106 to control selection of the bypass stage 105. When deselected, the FETs 131-132 are turned off to isolate the input $LNA_{IN}$ and the output $LNA_{OUT}$ from internal circuitry of the bypass stage 105. However, when the mode control circuit 106 turns on the FETs 131-132 a bypass path from the input $LNA_{IN}$ to the output $LNA_{OUT}$ via the bypass stage 105 is provided.

As shown in FIG. 3, the balun 125 includes a primary side or winding, and a secondary side or winding. Additionally, the primary and secondary windings of the balun 125 include a ground connection on opposite ends. By connecting the balun 125 in this manner, an output signal of the balun 125 is substantially out of phase with respect to an input signal to the balun 125.

Accordingly, the balun 125 serves to provide a phase inversion in the bypass stage 105, which compensates for a phase inversion provided by the gm FET 111 in the gain stage 101.

An inductance of balun 125 also serves to reduce bypass losses by tuning out the input matching inductor 104. Additionally, the capacitance of the tuning capacitor 122 can be selected such that the bypass stage 105 is tuned to operate over a desired frequency range.

Additional details of the LNA 100 can be similar to those described earlier.

Figure 4:
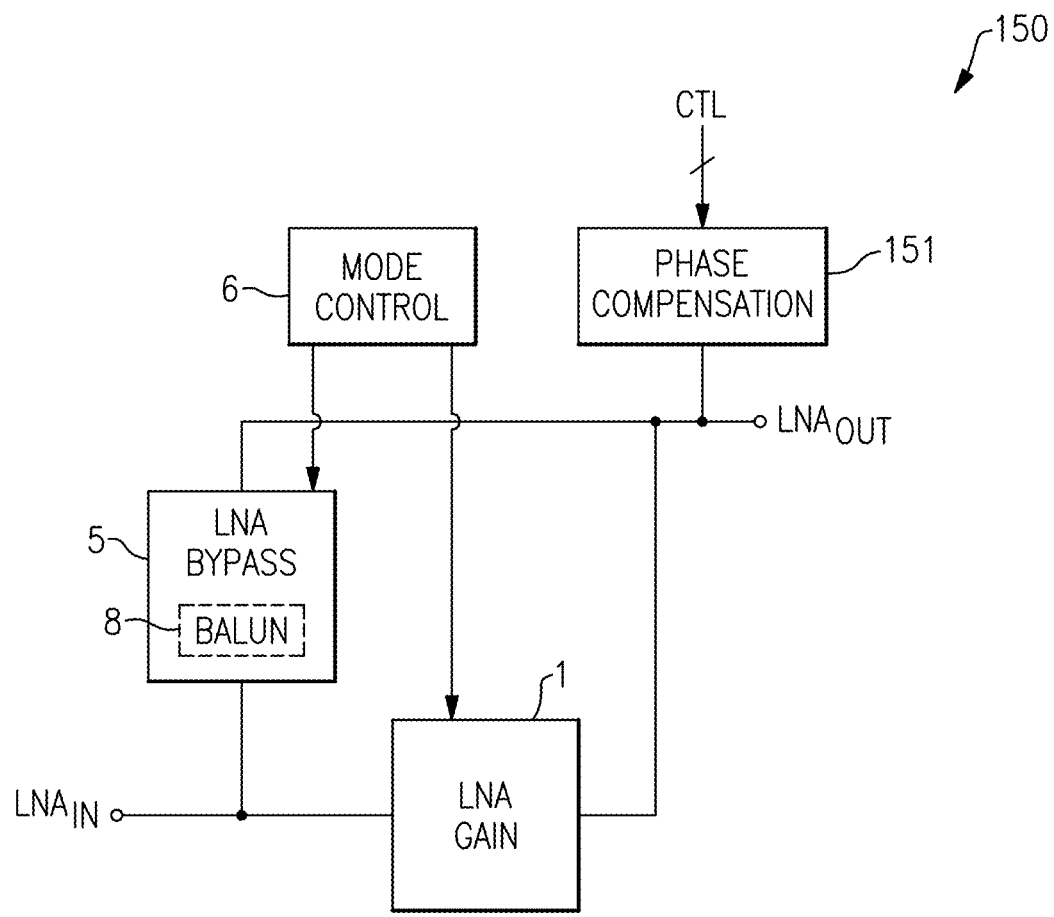
FIG. 4 is a schematic diagram of another embodiment of an LNA.

FIG. 4 is a schematic diagram of another embodiment of an LNA 150. The LNA 150 includes a gain stage 1, a bypass stage 5, a mode control circuit 6, and a phase compensation circuit 151. The gain stage 1 and the bypass stage 5 are electrically connected in parallel with one another between an input $LNA_{IN}$ and an output $LNA_{OUT}$. Additionally, the phase compensation circuit 151 is electrically connected to the output $LNA_{OUT}$, and receives a control signal CTL that controls an amount of phase compensation provided by the phase compensation circuit 151.

The LNA 150 of FIG. 4 is similar to the LNA 10 of FIG. 1, except that the LNA 150 of FIG. 4 includes the phase compensation circuit 151. The phase compensation circuit 151 can be used to reduce or eliminate a difference in phase delay between the bypass stage 5 and the gain stage 1, thereby providing enhanced phase performance. For example, the control signal CTL is adjustable to multiple values that provide different amounts of phase adjustment. By selecting an appropriate value of the control signal CTL, any residual difference in phase delay not compensated for by the balun 8 can be corrected.

Accordingly, the balun 8 provides coarse phase adjustment to compensate for an inversion of the gain stage 1. Additionally, the phase compensation circuit 151 provides fine phase adjustment to compensate for any residual difference in phase delay, including, for example, a phase difference arising from manufacturing variation.

Additional details of the LNA 150 can be similar to those described earlier.

Figure 5A:
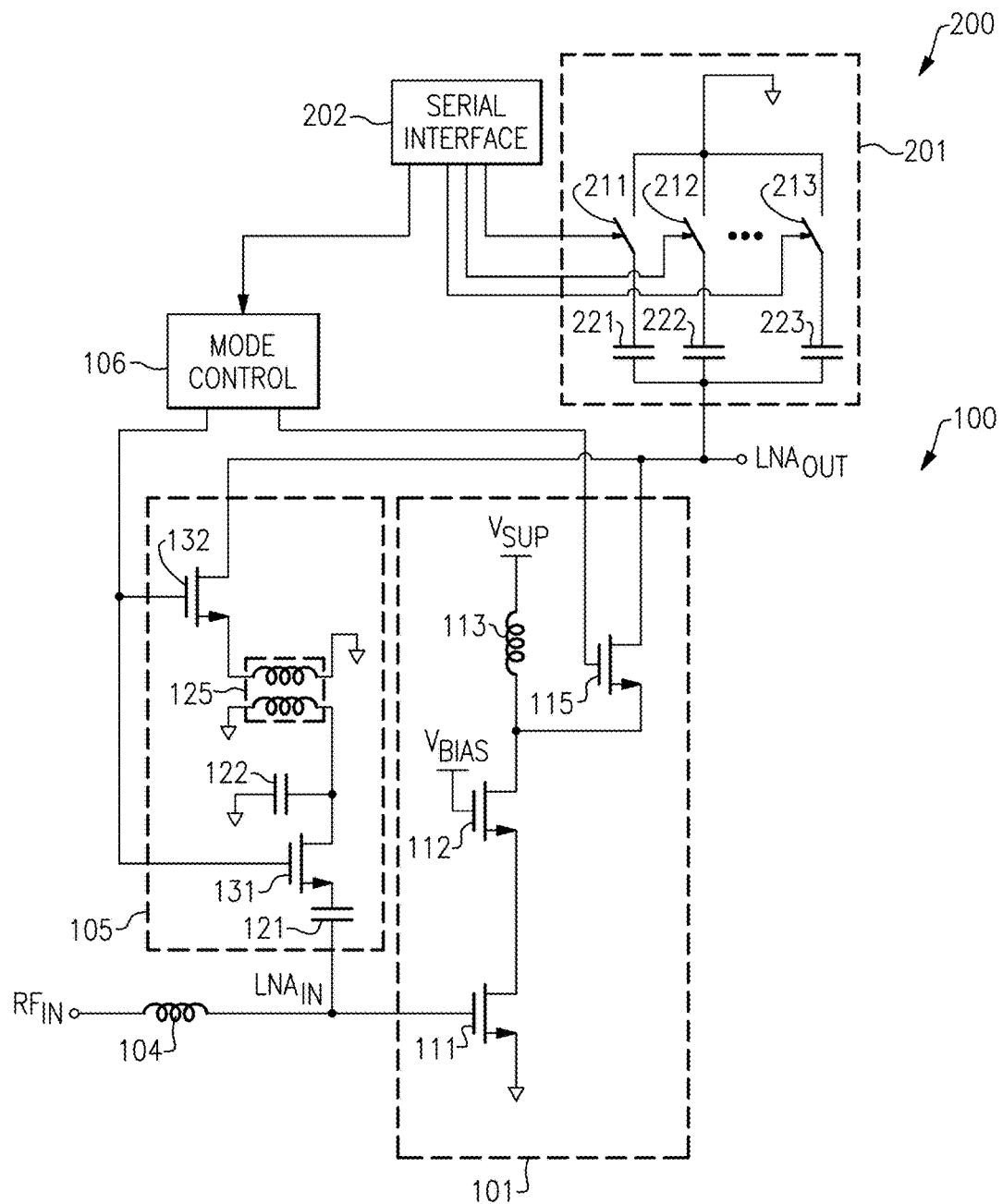
FIG. 5A is a schematic diagram of another embodiment of an LNA.

FIG. 5A is a schematic diagram of another embodiment of an LNA 200. The LNA 200 includes a gain stage 101, an input matching inductor 104, a bypass stage 105, a mode control circuit 106, a phase compensation circuit 201, and a serial interface 202.

The LNA 200 of FIG. 5A is similar to the LNA 100 of FIG. 3, except that the LNA 200 further includes the phase compensation circuit 201 and the serial interface 202. The serial interface 202 receives data (for instance, from a transceiver) to control the mode selected by the mode control circuit 6 and/or an amount of phase adjustment provided by the phase compensation circuit 201.

In the illustrated embodiment, the phase compensation circuit 201 includes capacitors 221-223 that are individually selectable by the capacitor selection switches 211-213, respectively. Although an implementation with three capacitors and three switches is shown, other configurations are possible, including, but not limited to, implementations using more or fewer capacitors and/or switches. Additionally, the active number of capacitors is chosen by phase adjustment data received via the serial interface 200. Although one specific implementation of a phase compensation circuit is shown, other configurations are possible.

Additional details of the LNA 200 can be as described earlier.

Figure 5B:
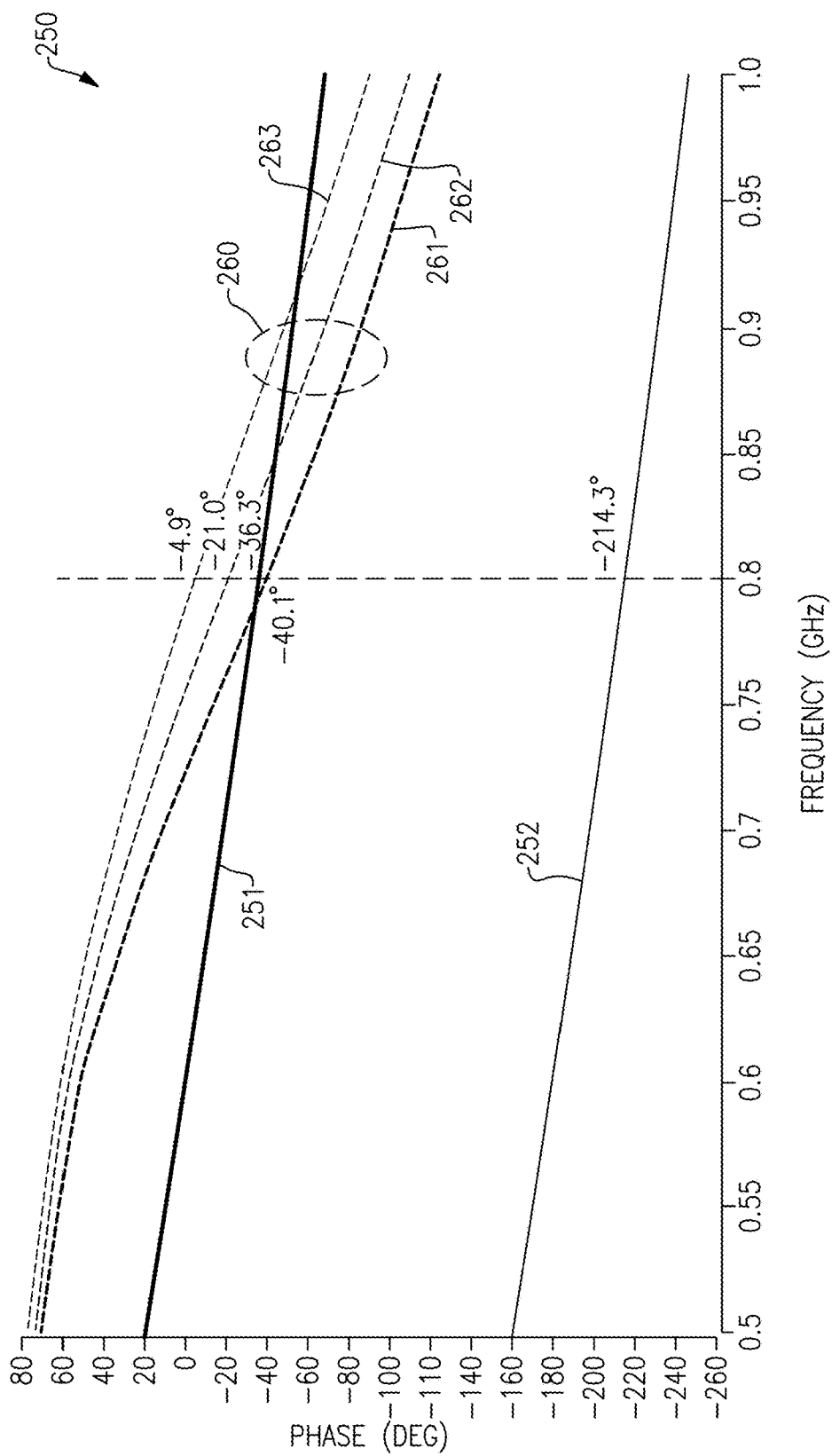
FIG. 5B is a graph of one example of frequency versus phase for LNAs operating in different modes.

FIG. 5B is a graph 250 of one example of frequency versus phase for LNAs operating in different modes.

The graph 250 includes a first plot 251 comparing a difference in phase delay between a gain mode (with various phase compensation capacitor selection modes shown by plots 260) and a bypass mode for one embodiment of the LNA 200 of FIG. 5A with the balun providing phase inversion.

The graph 250 also includes a second plot 252 comparing a difference in phase been a gain mode and a bypass mode for an example LNA that omits a balun.

As shown by a comparison of the first plot 251 to the second plot 252, including a balun provides enhanced phase delay matching between a gain mode and a bypass mode.

The graph 250 further includes a set of plots 260 associated with different amounts of output phase compensation provided by a phase compensation circuit. As shown by the plots 261-263 an amount of capacitance at the output of an LNA can be adjusted to provide fine-tuned control over a difference in phase delay between a bypass mode and a gain mode.

Although one specific example of simulation results for an LNA is shown in FIG. 5B, other simulations results are possible. For example, simulation results can vary based on a wide variety of factors, including, but not limited to, simulation parameters, LNA topology, and/or fabrication processes.

Figure 6A:
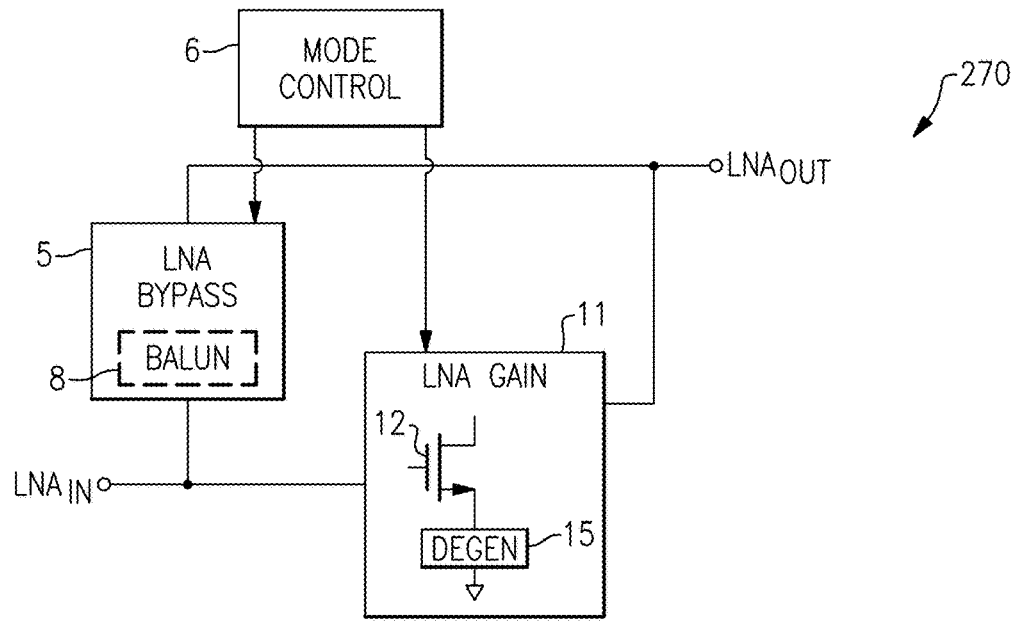
FIG. 6A is a schematic diagram of another embodiment of an LNA.

FIG. 6A is a schematic diagram of another embodiment of an LNA 270. The LNA 270 includes a bypass stage 5, a mode control circuit 6, and a gain stage 11. As shown in FIG. 6A, the bypass stage 5 includes a balun 8.

The LNA 270 of FIG. 6A is similar to the LNA 10 of FIG. 1, except the LNA 270 illustrates a specification implementation of a gain stage. In particular, the gain stage 11 of FIG. 6A includes a FET 12 and a degeneration circuit 15. The FET 12 includes a gate that receives the RF input signal from the input $LNA_{IN}$, a drain that generates an amplified RF signal, and a source electrically connected to ground via the degeneration circuit 15. The gain stage 11 of FIG. 6A illustrates an example of a common-source gain stage with source degeneration.

The degeneration circuit 15 can improve input impedance matching, enhance stability, and/or increase the LNA's linearity. In certain implementations, the degeneration circuit 15 includes at least one of an inductor or a resistor.

Figure 6B:
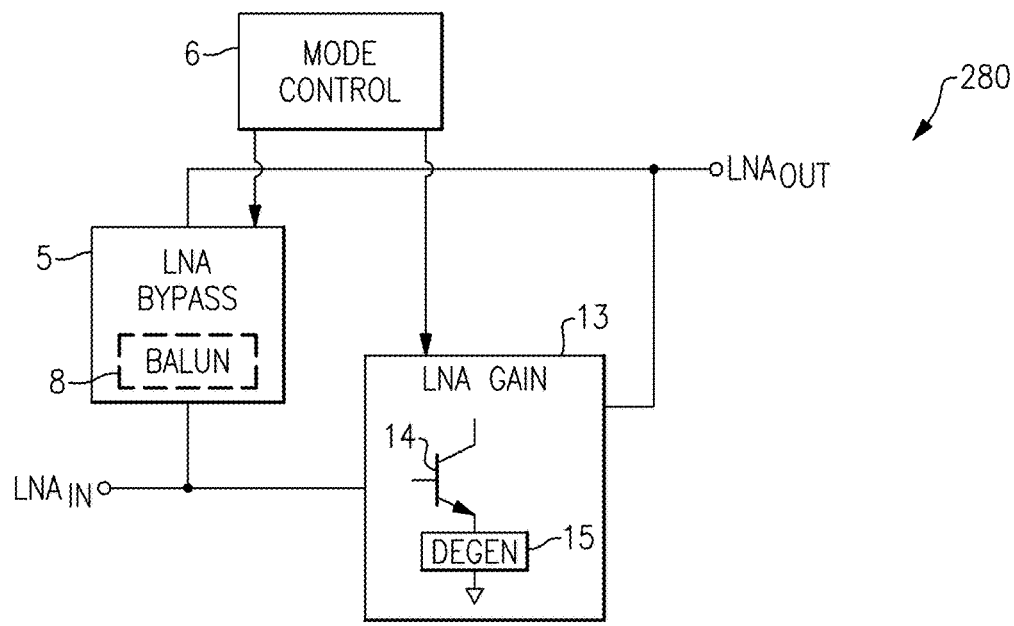
FIG. 6B is a schematic diagram of another embodiment of an LNA.

FIG. 6B is a schematic diagram of another embodiment of an LNA 280. The LNA 280 includes a bypass stage 5, a mode control circuit 6, and a gain stage 13. As shown in FIG. 6B, the bypass stage 5 includes a balun 8.

The LNA 280 of FIG. 6B is similar to the LNA 10 of FIG. 1, except the LNA 280 illustrates a specification implementation of a gain stage. In particular, the gain stage 13 of FIG. 6B includes a bipolar transistor 14 and a degeneration circuit 15. The bipolar transistor 14 includes a base that receives the RF input signal from the input $LNA_{IN}$, a collector that generates an amplified RF signal, and an emitter electrically connected to ground via the degeneration circuit 15. The gain stage 13 of FIG. 6B illustrates an example of a common-emitter gain stage with emitter degeneration.

Examples of RF Systems that Include One or More LNAs

LNAs can be included in a wide variety of RF systems, including, but not limited to, mobile phones, tablets, base stations, network access points, customer-premises equipment (CPE), laptops, and wearable electronics.

Although the examples below describe RF systems that can include one or more LNAs implemented in accordance with the teachings here, LNAs with a balun in a bypass stage can be included in other configurations of electronics.

An RF front-end system can include an LNA along a signal path between an antenna and a baseband system. Some RF front-end systems can further include power amplifiers, switches, filters, mixers, and/or other electronic circuitry.

Figure 7A:
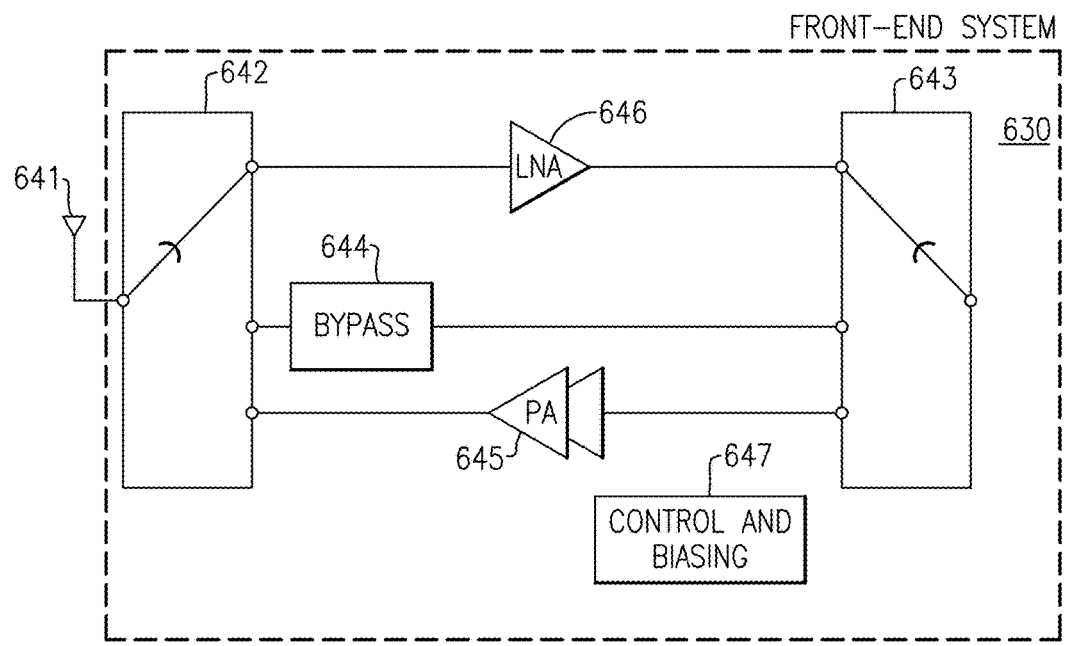
FIG. 7A is a schematic diagram of a front-end system according to one embodiment.

FIG. 7A is a schematic diagram of a front-end system 630 according to one embodiment.

The RF front-end system 630 is configured to receive RF signals from an antenna 641 and to transmit RF signals by way of the antenna 641. The illustrated front-end system 630 includes a first multi-throw switch 642, a second multi-throw switch 643, a receive signal path that includes an LNA 646, a bypass signal path that includes a bypass network 644, and a transmit signal path that includes a power amplifier 645. The LNA 646 can be implemented in accordance with any of the principles and advantages discussed herein. The bypass network 644 can include any suitable network for matching and/or bypassing the receive signal path and the transmit signal path. The bypass network 644 can be implemented by a passive impedance network or by a conductive trace or wire. The power amplifier 645 can be implemented in a wide variety of ways.

The first multi-throw switch 642 can selectively connect a particular signal path to the antenna 641. The first multi-throw switch 642 can electrically connect the receive signal path to the antenna 641 in a first state, electrically connect the bypass signal path to the antenna 641 in a second state, and electrically connect the transmit signal path to the antenna 641 in a third state.

The second multi-throw switch 643 can selectively connect a particular signal path to an input/output port of the front-end system 630, in which the particular signal path is the same signal path electrically connected to the antenna 641 by way of the first multi-throw switch 642. Accordingly, the second multi-throw switch 643 together with the first multi-throw switch 642 can selectively connect a particular signal path between the antenna 641 and the input/output port of the front-end system 630.

The control and biasing circuit 647 can be used to control and bias circuitry of the RF front-end system 630, including, but not limited to, the LNA 646.

Figure 7B:
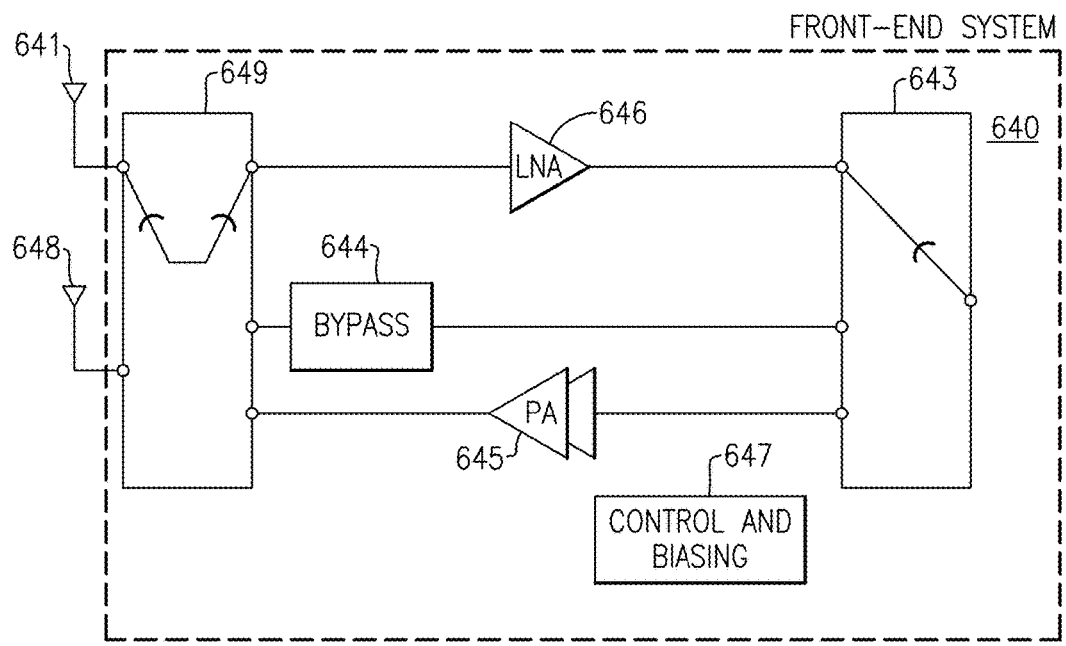
FIG. 7B is a schematic diagram of a front-end system according to another embodiment.

FIG. 7B is a schematic diagram of a front-end system 640 according to another embodiment.

The RF front-end system 640 of FIG. 7B is similar to the RF front-end system 630 of FIG. 7A, except that the first multi-throw switch 649 is configured to selectively connect a particular signal path to either a first antenna 641 or a second antenna 648. The multi-throw switch 649 can be a multi-throw, multi-pole switch.

The front-end systems of FIGS. 7A and 7B can be implemented in a packaged module. Such packaged modules can include relatively low cost laminate-based front-end modules that combine LNAs with power amplifiers and/or switch functions. Some such packaged modules can be multi-chip modules (MCMs).

In certain implementations, some or the all of the illustrated components in any of the front-end systems in FIGS. 7A and/or 7B can be embodied on a single integrated circuit or die. Such a die can be manufactured using any suitable process technology. According to some implementations, one or more antennas can be integrated with any of the front-end systems discussed herein.

Figure 8A:
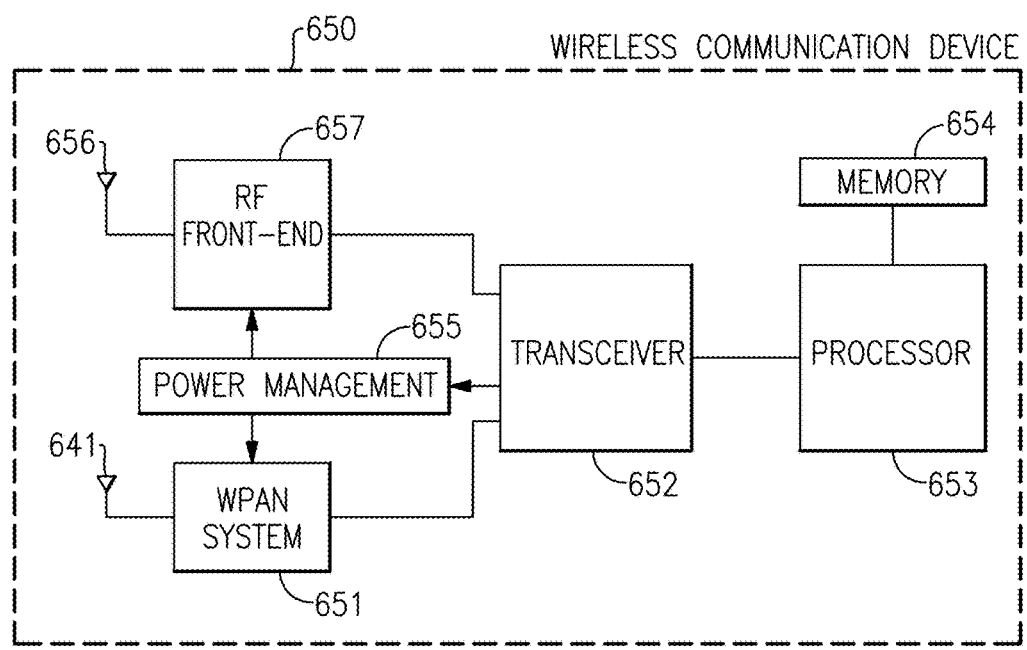
FIG. 8A is a schematic diagram of a wireless communication device according to one embodiment.
Figure 8B:
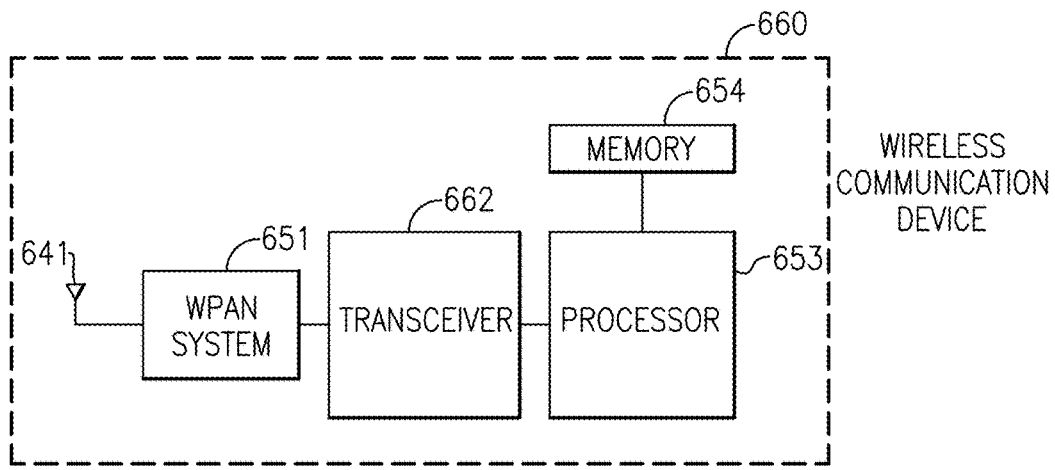
FIG. 8B is a schematic diagram of a wireless communication device according to another embodiment.

FIGS. 8A and 8B are schematic diagrams of illustrative wireless communication devices that include an LNA and/or a front-end system in accordance with one or more embodiments. The wireless communication devices can be any suitable wireless communication device. For instance, this device can be a mobile phone, such as a smart phone.

FIG. 8A is a schematic diagram of a wireless communication device 650 according to one embodiment.

As illustrated, the wireless communication device 650 includes a first antenna 641, a wireless personal area network (WPAN) system 651, a transceiver 652, a processor 653, a memory 654, a power management block 655, a second antenna 656, and an RF front-end system 657. Any of the LNAs discussed herein can be implemented in the WPAN system 651 and/or the RF front-end system 657. The WPAN system 651 is an RF front-end system configured for processing RF signals associated with personal area networks (PANs). The WPAN system 651 can be configured to transmit and receive signals associated with one or more WPAN communication standards, such as signals associated with one or more of Bluetooth, ZigBee, Z-Wave, Wireless USB, INSTEON, IrDA, or Body Area Network. In another embodiment, a wireless communication device can include a wireless local area network (WLAN) system in place of the illustrated WPAN system, and the WLAN system can process Wi-Fi signals.

FIG. 8B is a schematic diagram of a wireless communication device 660 according to another embodiment.

The illustrated wireless communication device 660 of FIG. 8B is a device configured to communicate over a PAN. This wireless communication device 660 can be relatively less complex than the wireless communication device 650 of FIG. 8A. As illustrated, the wireless communication device 660 includes an antenna 641, a WPAN system 651, a transceiver 662, a processor 653, and a memory 654. The WPAN system 660 can include an LNA in accordance with any of the principles and advantages discussed herein.

Figure 9:
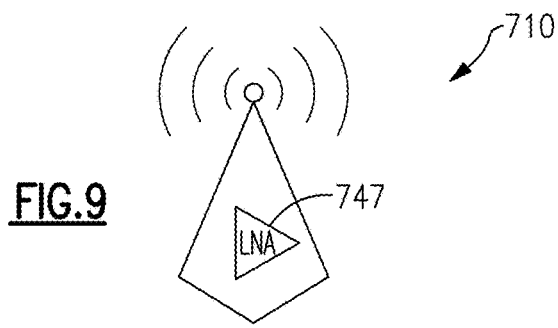
FIG. 9 is a schematic diagram of one embodiment of a base station.

FIG. 9 is a schematic diagram of one embodiment of a base station 710. The base station 710 includes an LNA 747. Although not illustrated in FIG. 9 for clarity, the base station 700 includes additional components and structures.

The LNA 747 can be implemented using one or more features disclosed herein. Although FIG. 9 illustrates one example of an RF system that can include an LNA implemented in accordance with the teachings herein, LNAs can be used in other configurations of electronics.

Figure 10:
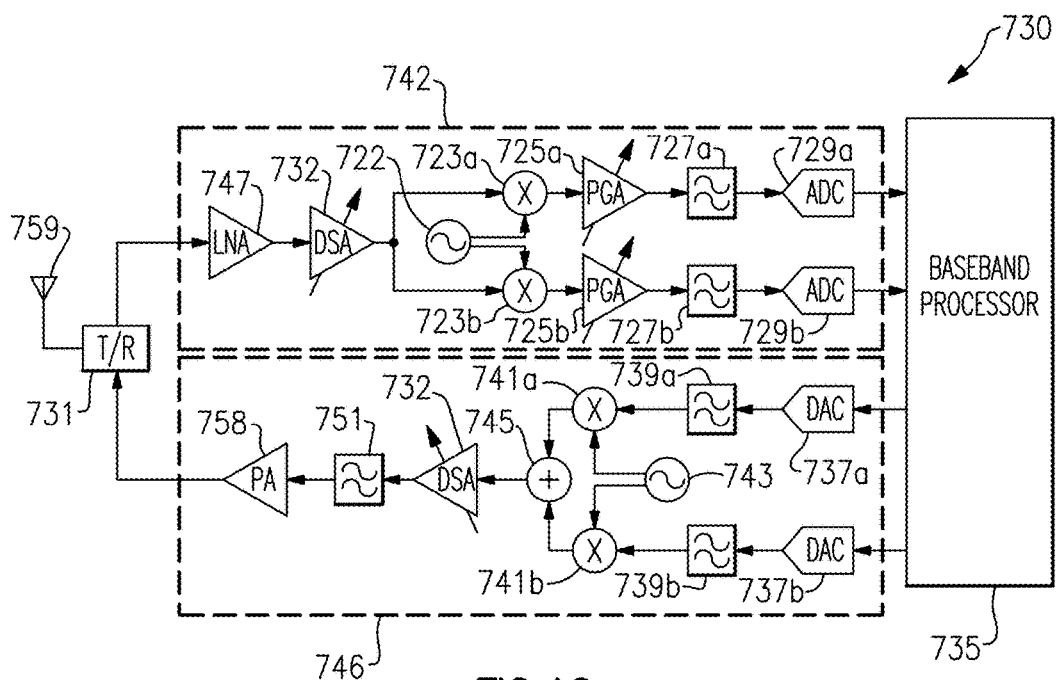
FIG. 10 is a schematic diagram of one embodiment of an RF system.

FIG. 10 is a schematic diagram of one embodiment of an RF system 730. The RF system 730 includes a baseband processor 735, a receive path 742, a transmit path 746, a T/R switch 731, and an antenna 759. The RF system 700 illustrates one example implementation of radio frequency circuitry suitable for operation in a wireless communication device or base station. However, other implementations are possible.

The RF system 730 can be used for transmitting and/or receiving RF signals using a variety of communication standards, including, for example, Global System for Mobile Communications (GSM), Code Division Multiple Access (CDMA), wideband CDMA (W-CDMA), Long Term Evolution (LTE), Advanced LTE, 3G, 4G, Enhanced Data Rates for GSM Evolution (EDGE), wireless local loop (WLL), and/or Worldwide Interoperability for Microwave Access (WiMax), as well as other proprietary and non-proprietary communications standards.

The transmit path 746 and the receive path 742 can be used for transmitting and receiving signals over the antenna 759. Although one implementation of the RF system 730 is illustrated in FIG. 10, the RF system 730 can be modified in any suitable manner. For example, the base station 730 can be modified to include additional transmit paths, receive paths, and/or antennas.

In the illustrated configuration, the receive path 742 includes an LNA 747, a digital step attenuator (DSA) 732, a local oscillator 722, a first mixer 723a, a second mixer 723b, a first programmable gain amplifier (PGA) 725a, a second PGA 725b, a first filter 727a, a second filter 727b, a first analog-to-digital converter (ADC) 729a, and a second ADC 729b. Although one implementation of a receive path is illustrated in FIG. 10, a receive path can include more or fewer components and/or a different arrangement of components.

An RF signal can be received on the antenna 759 and provided to the receive path 742 using the T/R switch 731. For example, the T/R switch 731 can be controlled to electrically couple the antenna 759 to an input of the LNA 747, thereby providing the received RF signal to the LNA's input.

The LNA 747 provides low noise amplification such that the LNA 747 amplifies the received RF signal while adding or introducing a relatively small amount of noise. The LNA 747 is a multi-mode LNA operable in at least a gain mode and a bypass mode. When in the gain mode, the LNA 747 amplifies the received RF signal using a gain circuit that provides inverting amplification. Additionally, when in the bypass mode, the gain circuit is bypassed and the received RF signal is routed through a bypass circuit. The bypass circuit includes a balun that compensates for a difference of a phase delay of the bypass circuit relative to a phase delay of the gain circuit.

Thus, the LNA 747 can be switched between difference modes without exhibiting an abrupt phase discontinuity. Such a phase discontinuity can lead to a variety of problems, including, for example, loss of frames and/or limitations in moving about a cell in mobile applications.

As shown in FIG. 10, the amplified RF signal generated by the LNA 747 is provided to the DSA 732. In the illustrated embodiment, an amount of attenuation provided by the DSA 732 is digitally-controllable, and can be set to achieve a desired signal power level.

The first and second mixers 723a, 723b receive first and second local oscillator clock signals, respectively, from the local oscillator 722. The first and second local oscillator clock signals can have about the same frequency and a phase difference equal to about a quarter of a period, or about 90°. The first and second mixers 723a, 723b downconvert the output of the DSA 732 using the first and second local oscillator clock signals, respectively, thereby generating first and second demodulated signals. The first and second demodulated signals can have a relative phase difference of about a quarter of a period, or about 90°, and can correspond to an in-phase (I) receive signal and a quadrature-phase (Q) signal, respectively. In certain implementations, one of the first or second oscillator clock signals is generated by phase shifting from the other.

The first and second local oscillator clock signals can have a frequency selected to achieve a desired intermediate frequency and/or baseband frequency for the first and second demodulated signals. For example, multiplying the output of the DSA 732 by a sinusoidal signal from the local oscillator 722 can produce a mixed signal having a frequency content centered about the sum and difference frequencies of the carrier frequency of the DSA output signal and the oscillation frequency of the local oscillator 722.

In the illustrated configuration, the first and second demodulated signals are amplified using the first and second programmable gain amplifiers 725a, 725b, respectively. To aid in reducing output noise, the outputs of the first and second programmable gain amplifiers 725a, 725b can be filtered using the first and second filters 727a, 727b, which can be any suitable filter, including, for example, low pass, band pass, or high pass filters. The outputs of the first and second filters 727a, 727b can be provided to the first and second ADCs 729a, 729b, respectively. The first and second ADCs 729a, 729b can have any suitable resolution. In the illustrated configuration, the outputs of the first and second ADCs 729a, 729b are provided to the baseband processor 735 for processing.

The baseband processor 735 can be implemented in a variety of ways. For instance, the baseband processor 735 can include a digital signal processor, a microprocessor, a programmable core, the like, or any combination thereof. Moreover, in some implementations, two or more baseband processors can be included in the RF system 730.

As shown in FIG. 10, the transmit path 746 receives data from the baseband processor 735 and is used to transmit RF signals via the antenna 759. The transmit path 746 and the receive path 742 both operate using the antenna 759, and access to the antenna 759 is controlled using the T/R switch 731. The illustrated transmit path 746 includes first and second digital-to-analog converters (DACs) 737a, 737b, first and second filters 739a, 739b, first and second mixers 741a, 741b, a local oscillator 743, a combiner 745, a DSA 732, an output filter 751, and a power amplifier 758. Although one implementation of a transmit path is illustrated in FIG. 10, a transmit path can include more or fewer components and/or a different arrangement of components.

The baseband processor 735 can output a digital in-phase (I) signal and a digital quadrature-phase (Q) signal, which can be separately processed until they are combined using the combiner 745. The first DAC 737a converts the digital I signal into an analog I signal, and the second DAC 737b converts the digital Q signal into an analog Q signal. The first and second DACs 737a, 737b can have any suitable precision. The analog I signal and the analog Q signal can be filtered using the first and second filters 739a, 739b, respectively. The outputs of the first and second filters 739a, 739b can be upconverted using the first and second mixers 741a, 741b, respectively. For example, the first mixer 741a is used to upconvert the output of the first filter 739a based on an oscillation frequency of the local oscillator 743, and the second mixer 741b is used to upconvert the output of the second filter 739b based on the oscillation frequency of the local oscillator 743.

The combiner 743 combines the outputs of the first and second mixers 741a, 741b to generate a combined RF signal. The combined RF signal is provided to an input of the DSA 732, which is used to control a signal power level of the combined RF signal.

The output of the DSA 732 can be filtered using the output filter 751, which can be, for example, a low pass, band pass, or high pass filter configured to remove noise and/or unwanted frequency components from the signal. The output of the output filter 751 can be amplified by a power amplifier 758. In some implementations, the power amplifier 758 includes a plurality of stages cascaded to achieve a target gain. The power amplifier 758 can provide an amplified RF signal to the antenna 759 through the T/R switch 731.

The LNA 747 of FIG. 10 can be implemented using one or more features discloses herein. Although FIG. 10 illustrates one example of an RF system that can include an LNA implemented in accordance with the teachings herein, LNAs can be used in other configurations of electronics.

Figure 11A:
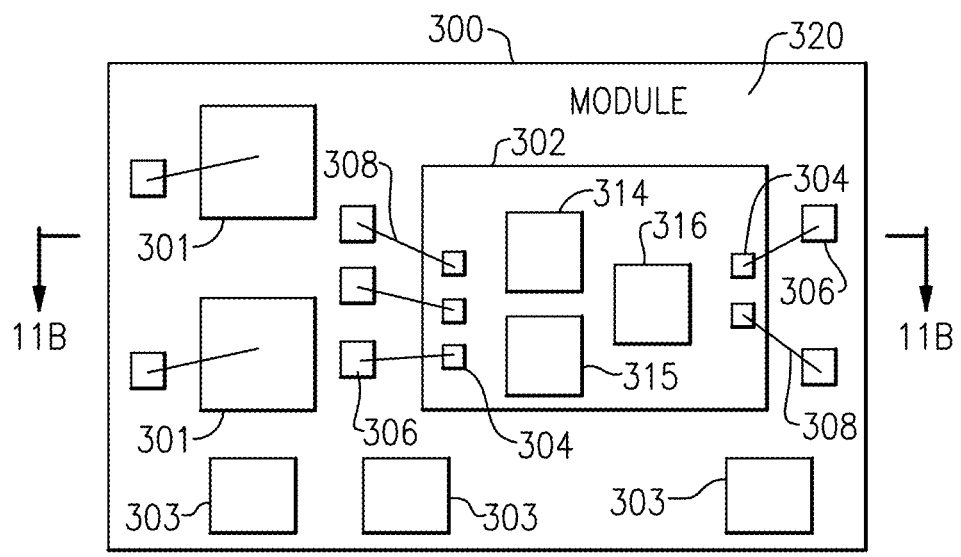
FIG. 11A is a schematic diagram of one embodiment of a packaged module.
Figure 11B:
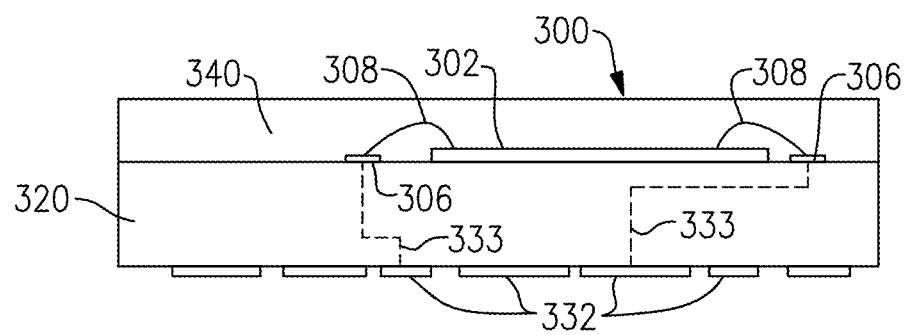
FIG. 11B is a schematic diagram of a cross-section of the packaged module of FIG. 11A taken along the lines 11B-11B.

FIG. 11A is a schematic diagram of one embodiment of a packaged module 300. FIG. 11B is a schematic diagram of a cross-section of the packaged module 300 of FIG. 11A taken along the lines 11B-11B.

The packaged module 300 includes radio frequency components 301, a semiconductor die 302, surface mount devices 303, wirebonds 308, a package substrate 320, and encapsulation structure 340. The package substrate 320 includes pads 306 formed from conductors disposed therein. Additionally, the semiconductor die 302 includes pins or pads 304, and the wirebonds 308 have been used to connect the pads 304 of the die 302 to the pads 306 of the package substrate 320.

The semiconductor die 302 includes an LNA gain stage 314, an LNA bypass stage 315 including a balun, and a mode control circuit 316, which are implemented in accordance with one or more features disclosed herein. Although the packaged module 300 illustrates one example of a module that can include an LNA implemented in accordance with the teachings herein, LNAs can be used in other configurations of electronics.

In certain implementations, the mode control circuit 316 is coupled to a serial interface of the semiconductor die 302. For example, the semiconductor die 302 can include a mobile industry processor interface (MIPI) radio frequency front-end (RFFE) bus, an inter integrated circuit ($I^2C$) bus, a serial peripheral interface (SPI) bus, or other suitable interface for receiving data, such as LNA mode selection data.

The packaging substrate 320 can be configured to receive a plurality of components such as the semiconductor die 302 and the surface mount devices 303, which can include, for example, surface mount capacitors and/or inductors. In one implementation, the radio frequency components 301 include integrated passive devices (IPDs).

As shown in FIG. 11B, the packaged module 300 is shown to include a plurality of contact pads 332 disposed on the side of the packaged module 300 opposite the side used to mount the semiconductor die 302. Configuring the packaged module 300 in this manner can aid in connecting the packaged module 300 to a circuit board, such as a phone board of a wireless device. The example contact pads 332 can be configured to provide radio frequency signals, bias signals, and/or power (for example, a power supply voltage and ground) to the semiconductor die 302 and/or the surface mount devices 303. As shown in FIG. 11B, the electrical connections between the contact pads 332 and the semiconductor die 302 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Figure 12:
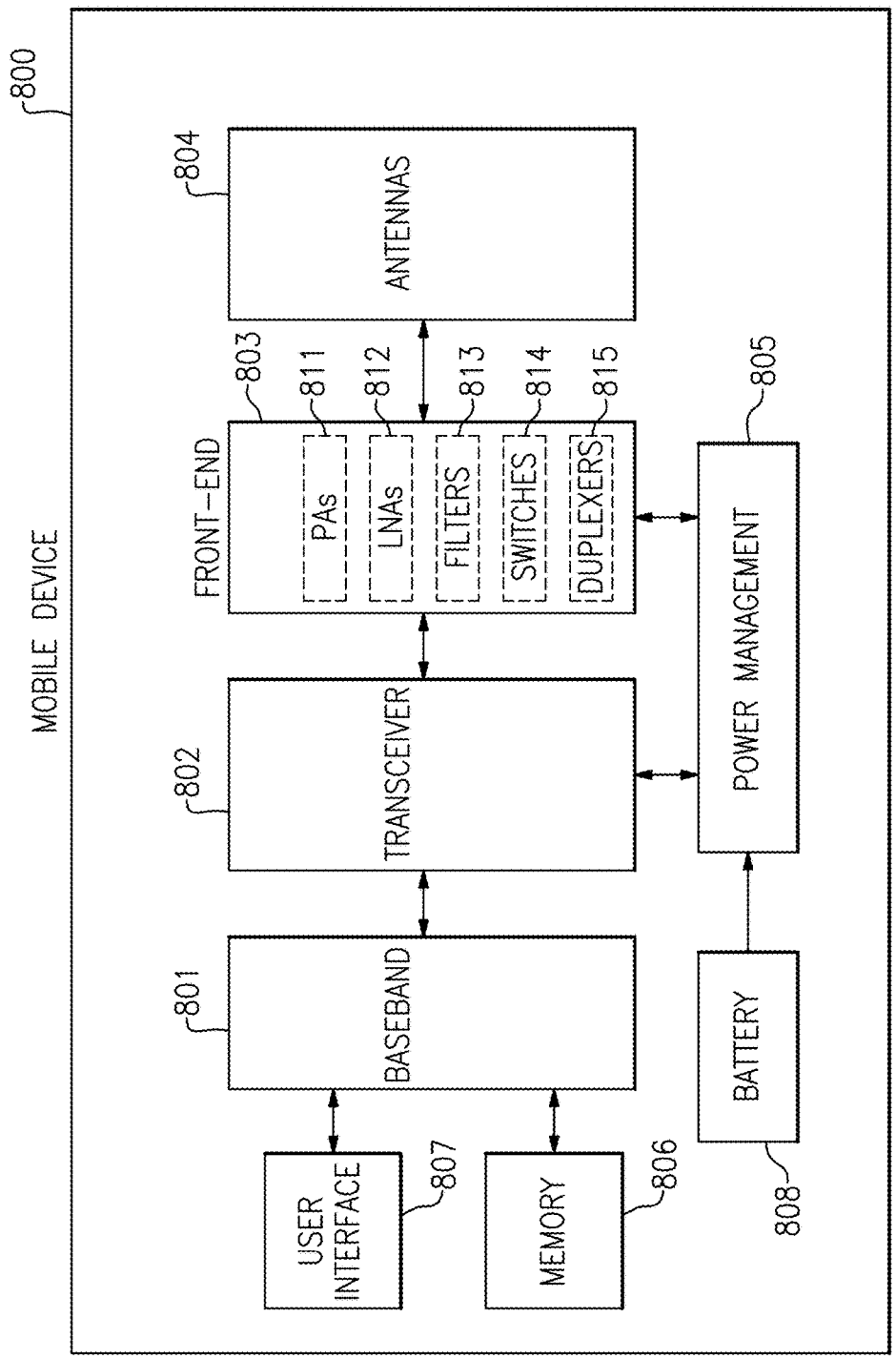
FIG. 12 is a schematic diagram of one embodiment of a mobile device.

FIG. 12 is a schematic diagram of one embodiment of a mobile device 800. The mobile device 800 includes a baseband system 801, a transceiver 802, a front-end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 12 as the transceiver 802. In one example, separate components (for instance, separate circuits or dies) can be provided for handling certain types of RF signals.

The front-end system 803 aids is conditioning signals transmitted to and/or received from the antennas 804. In the illustrated embodiment, the front-end system 803 includes one or more power amplifiers (PAs) 811, one or more low noise amplifiers (LNAs) 812, one or more filters 813, one or more switches 814, and one or more duplexers 815. However, other implementations are possible.

For example, the front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

At least one of the LNAs 812 is implemented using one or more features disclosed herein. Although FIG. 12 illustrates one example of an RF communication system that can include LNAs implemented in accordance with the teachings herein, LNAs can be used in other configurations of electronics.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front-end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 12, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 12, the power management system 805 receives a battery voltage from the battery 808. The battery 808 can be any suitable battery for use in the mobile device 800, including, for example, a lithium-ion battery.

APPLICATIONS

The principles and advantages of the embodiments herein can be used for any other systems or apparatus that have needs for low noise amplification. Examples of such apparatus include RF communication systems. RF communications systems include, but are not limited to, mobile phones, tablets, base stations, network access points, customer-premises equipment (CPE), laptops, and wearable electronics. Thus, the low noise amplifiers herein can be included in various electronic devices, including, but not limited to, consumer electronic products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A wireless communication device comprising:
a low noise amplifier including a mode control circuit configured to operate the low noise amplifier in a selected mode chosen from a plurality of modes including a first gain mode and a bypass mode, a first gain circuit electrically connected between an input terminal and an output terminal and operable to provide inverting amplification to a radio frequency input signal received at the input terminal in the first gain mode, and a bypass circuit electrically connected in parallel with the first gain circuit between the input terminal and the output terminal, the bypass circuit including a balun operable to provide an inversion to the radio frequency input signal in the bypass mode so as to compensate for a difference in phase delay between the bypass circuit and the first gain circuit; and
an antenna configured to provide the radio frequency input signal to the low noise amplifier.

2. The wireless communication device of claim 1 wherein the low noise amplifier further includes a phase compensation circuit electrically connected to the output terminal and configured to further compensate for the difference in phase delay.

3. The wireless communication device of claim 2 wherein the phase compensation circuit includes a plurality of capacitors that are digitally selectable.

4. The wireless communication device of claim 2 the low noise amplifier further includes a serial interface configured to receive data operable to control an amount of phase adjustment provided by the phase compensation circuit.

5. The wireless communication device of claim 2 wherein the balun is operable to provide a coarse phase adjustment and the phase compensation circuit is operable to provide a fine phase adjustment.

6. The wireless communication device of claim 1 the low noise amplifier further includes an input matching inductor electrically connected between the input terminal and a radio frequency terminal, the balun having an inductance that compensates for a loss of the input matching inductor.

7. The wireless communication device of claim 1 wherein the low noise amplifier further includes a second gain circuit electrically connected between the input terminal and the output terminal in parallel with the first gain circuit, the second gain circuit operable to provide inverting amplification to the radio frequency input signal in a second gain mode of the plurality of modes.

8. The wireless communication device of claim 1 wherein the balun includes a primary winding and a secondary winding, the primary winding and the secondary winding connected to ground on opposite ends relative to one another such that the balun provides the inversion to the radio frequency input signal.

9. A low noise amplifier comprising:
a mode control circuit configured to operate the low noise amplifier in a selected mode chosen from a plurality of modes including a first gain mode and a bypass mode;
a first gain circuit electrically connected between an input terminal configured to receive a radio frequency input signal and an output terminal configured to provide a radio frequency output signal, the first gain circuit operable to provide inverting amplification to the radio frequency input signal in the first gain mode; and
a bypass circuit electrically connected in parallel with the first gain circuit between the input terminal and the output terminal, the bypass circuit including a balun operable to provide an inversion to the radio frequency input signal in the bypass mode so as to compensate for a difference in phase delay between the bypass circuit and the first gain circuit.

10. The low noise amplifier of claim 9 further comprising a phase compensation circuit electrically connected to the output terminal and configured to further compensate for the difference in phase delay.

11. The low noise amplifier of claim 10 wherein the phase compensation circuit includes a plurality of capacitors that are digitally selectable.

12. The low noise amplifier of claim 10 further comprising a serial interface configured to receive data operable to control an amount of phase adjustment provided by the phase compensation circuit.

13. The low noise amplifier of claim 10 wherein the balun is operable to provide a coarse phase adjustment and the phase compensation circuit is operable to provide a fine phase adjustment.

14. The low noise amplifier of claim 9 further comprising an input matching inductor electrically connected between the input terminal and a radio frequency terminal, the balun having an inductance that compensates for a loss of the input matching inductor.

15. The low noise amplifier of claim 9 wherein the mode control circuit is operable to select the bypass circuit and deselect the first gain circuit in the bypass mode, and to select the first gain circuit and deselect the bypass circuit in the first gain mode.

16. The low noise amplifier of claim 9 further comprising a second gain circuit electrically connected between the input terminal and the output terminal in parallel with the first gain circuit, the second gain circuit operable to provide inverting amplification to the radio frequency input signal in a second gain mode of the plurality of modes.

17. The low noise amplifier of claim 9 wherein the balun includes a primary winding and a secondary winding, the primary winding and the secondary winding connected to ground on opposite ends relative to one another such that the balun provides the inversion to the radio frequency input signal.

18. A radio frequency front-end system comprising:
a low noise amplifier including a mode control circuit configured to operate the low noise amplifier in a selected mode chosen from a plurality of modes including a first gain mode and a bypass mode, a first gain circuit electrically connected between an input terminal and an output terminal and operable to provide inverting amplification to a radio frequency input signal received at the input terminal in the first gain mode, and a bypass circuit electrically connected in parallel with the first gain circuit between the input terminal and the output terminal, the bypass circuit including a balun operable to provide an inversion to the radio frequency input signal in the bypass mode so as to compensate for a difference in phase delay between the bypass circuit and the first gain circuit; and
an input switch including a first throw operable to provide the radio frequency input signal to the input terminal of the low noise amplifier.

19. The radio frequency front-end system of claim 18 wherein the low noise amplifier further includes a phase compensation circuit electrically connected to the output terminal and configured to further compensate for the difference in phase delay.

20. The radio frequency front-end system of claim 19 wherein the balun is operable to provide a coarse phase adjustment and the phase compensation circuit is operable to provide a fine phase adjustment.

* * * * *